(12) United States Patent
Denison et al.

(10) Patent No.: US 8,580,650 B2
(45) Date of Patent: Nov. 12, 2013

(54) LATERAL SUPERJUNCTION EXTENDED DRAIN MOS TRANSISTOR

(75) Inventors: Marie Denison, Plano, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 13/284,054

(22) Filed: Oct. 28, 2011

(65) Prior Publication Data

US 2012/0104493 A1    May 3, 2012

Related U.S. Application Data

(60) Provisional application No. 61/407,766, filed on Oct. 28, 2010.

(51) Int. Cl.
*H01L 21/76* (2006.01)
(52) U.S. Cl.
USPC .................................. 438/429; 257/E21.548
(58) Field of Classification Search
USPC .................................................. 438/140, 429
See application file for complete search history.

(56) References Cited

U.S. PATENT DOCUMENTS

| | | | |
|---|---|---|---|
| 6,670,673 B2 * | 12/2003 | Sakakibara | 257/328 |
| 7,381,603 B2 * | 6/2008 | Hossain et al. | 438/197 |
| 7,642,139 B2 * | 1/2010 | Takaishi | 438/140 |

* cited by examiner

*Primary Examiner* — Chandra Chaudhari
(74) *Attorney, Agent, or Firm* — W. James Brady, III; Frederick J. Telecky, Jr.

(57) ABSTRACT

An integrated circuit containing an extended drain MOS transistor with deep semiconductor (SC) RESURF trenches in the drift region, in which each deep SC RESURF trench has a semiconductor RESURF layer at a sidewall of the trench contacting the drift region. The semiconductor RESURF layer has an opposite conductivity type from the drift region. The deep SC RESURF trenches have depth:width ratios of at least 5:1, and do not extend through a bottom surface of the drift region. A process of forming an integrated circuit with deep SC RESURF trenches in the drift region by etching undersized trenches and counterdoping the sidewall region to form the semiconductor RESURF layer. A process of forming an integrated circuit with deep SC RESURF trenches in the drift region by etching trenches and growing an epitaxial layer on the sidewall region to form the semiconductor RESURF layer.

13 Claims, 13 Drawing Sheets

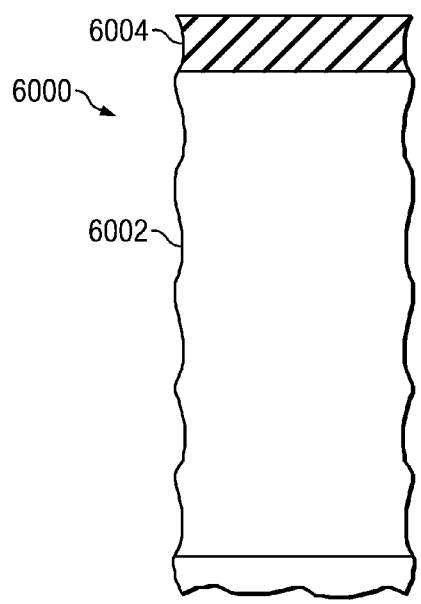
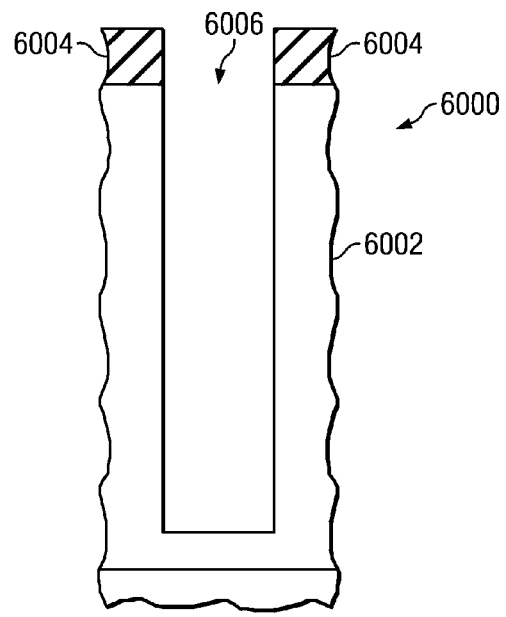
FIG. 6A   FIG. 6B
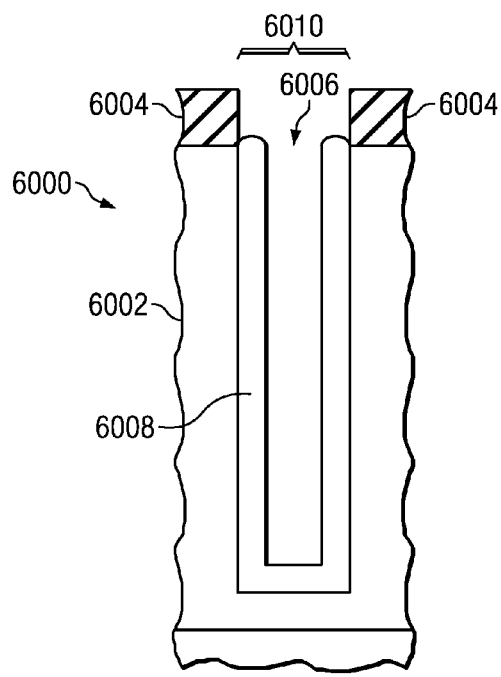
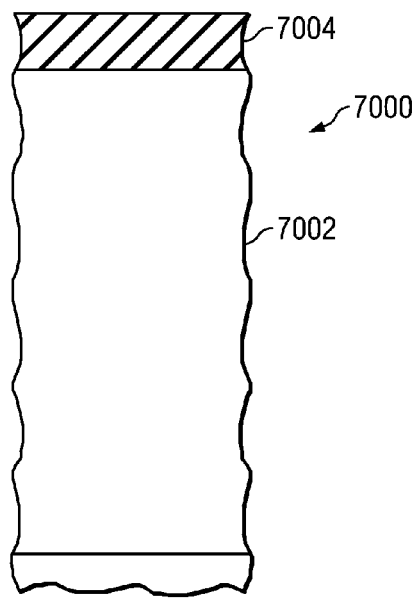
FIG. 6C   FIG. 7A

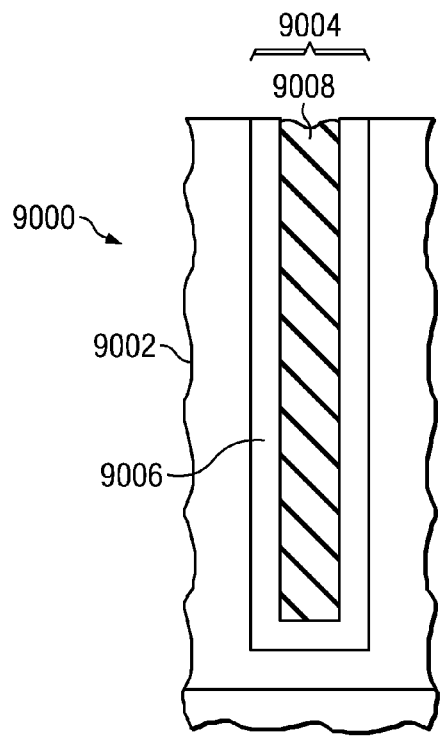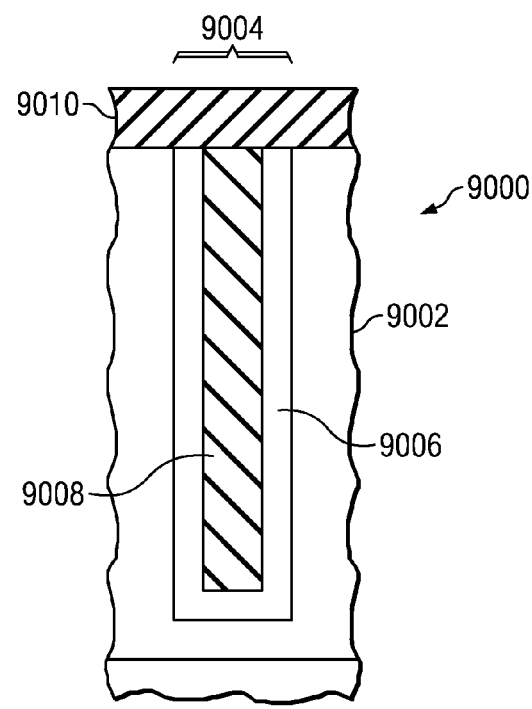
FIG. 9A  FIG. 9B
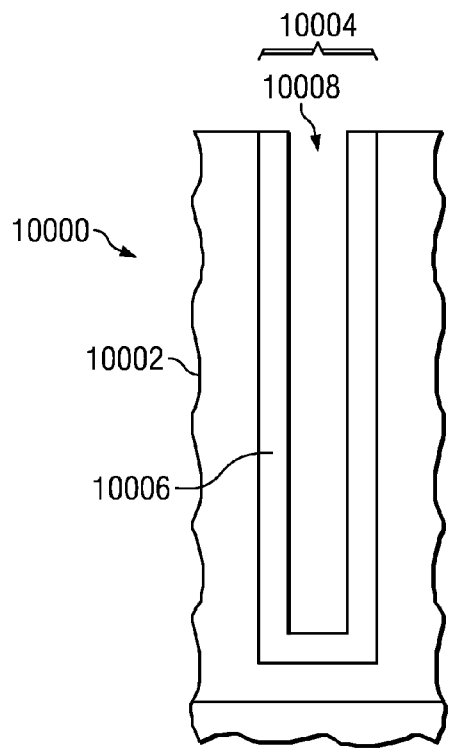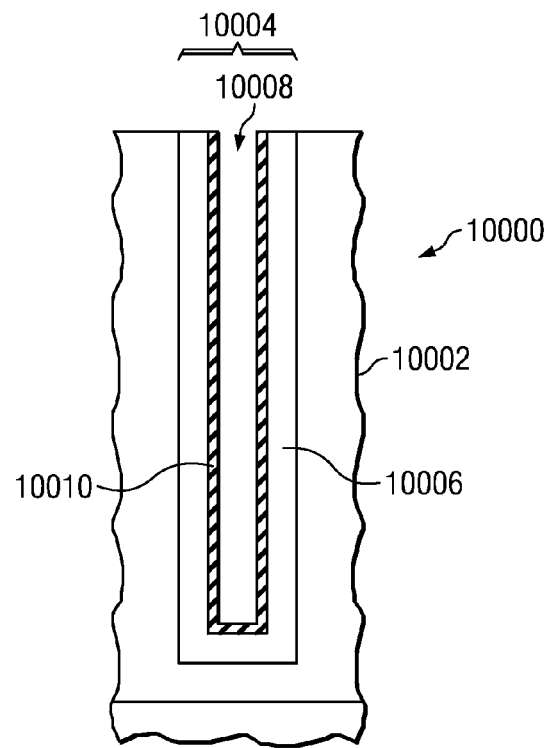
FIG. 10A  FIG. 10B

LATERAL SUPERJUNCTION EXTENDED DRAIN MOS TRANSISTOR

This application claims the benefit of U.S. Provisional Application No. 61/407,766, filed Oct. 28, 2010, the entirety of which is herein incorporated by reference.

FIELD OF THE INVENTION

This invention relates to the field of integrated circuits. More particularly, this invention relates to extended drain MOS transistors in integrated circuits.

BACKGROUND OF THE INVENTION

An integrated circuit may include a lateral extended drain metal oxide semiconductor (MOS) transistor, for example to switch or regulate a voltage higher than that used to power logic circuits in the integrated circuit. It may be desirable to reduce an area of the extended drain MOS transistor which provides a desired series resistance and operating drain voltage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a lateral extended drain MOS transistor with deep semiconductor (SC) RESURF trenches in the drift region. The deep SC RESURF trenches have semiconductor RESURF material in contact with the drift region, in which the semiconductor RESURF material has an opposite conductivity type from the drift region.

DESCRIPTION OF THE VIEWS OF THE DRAWING

FIG. 6A through FIG. 6C are cross sections of an integrated circuit containing deep SC RESURF trenches in a lateral extended drain MOS transistor, formed according to an embodiment, depicted in successive stages of fabrication.

FIG. 7A through FIG. 7C are cross sections of an integrated circuit containing deep SC RESURF trenches in a lateral extended drain MOS transistor, formed according to an embodiment, depicted in successive stages of fabrication.

FIG. 9A and FIG. 9B are cross sections of an integrated circuit containing deep SC RESURF trenches in a lateral extended drain MOS transistor, formed according to an embodiment, depicted in successive stages of fabrication.

FIG. 10A and FIG. 10B are cross sections of an integrated circuit containing deep SC RESURF trenches in a lateral extended drain MOS transistor, formed according to an embodiment, depicted in successive stages of fabrication.

DETAILED DESCRIPTION OF EXAMPLE EMBODIMENT

Figure 1:
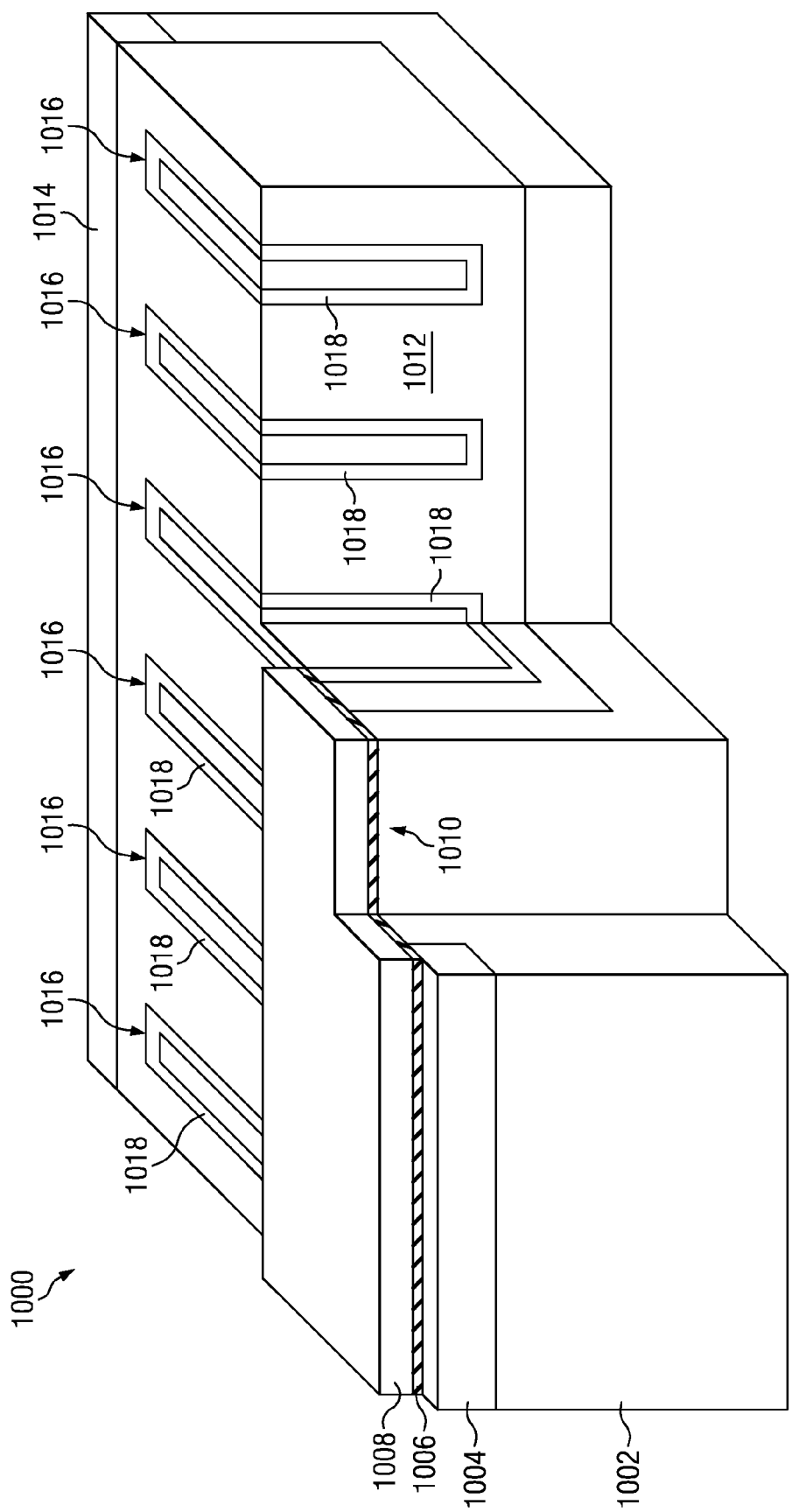
FIG. 1 is a perspective of an integrated circuit containing a lateral extended drain MOS transistor with deep SC RESURF trenches in a drift region, formed according to a first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may contain a lateral extended drain MOS transistor with a lateral drift region. Deep semiconductor (SC) RESURF trenches are formed in the drift region. Semiconductor RESURF material with an opposite conductivity type from the drift region is formed at vertical surfaces of the trenches in contact with the drift region. In one embodiment, the deep SC RESURF trenches are between 200 nanometers and 5 microns wide, have a depth:width ratio of at least 5:1, and a doping level of the semiconductor RESURF material is between $5\times10^{15}$ cm$^{-3}$ and $1\times10^{18}$ cm$^{-3}$. In one embodiment, the deep SC RESURF trenches may be formed by growing or depositing semiconductor RESURF material in trenches etched in the drift region. In another embodiment, undersized trenches may be etched in the drift region, followed by a doping process which introduces dopants into the trench and diffuses the dopants, of an opposite conductivity type from the drift region, into the drift region at the trench surfaces, forming the semiconductor RESURF material. Forming the MOS transistor with deep semiconductor RESURF trenches in the extended drain may provide a lower drain-source resistance than an MOS transistor of equivalent area which is free of the RESURF trenches.

In an embodiment, the extended drain MOS transistor may have a trenched gate in which gate trench fingers are aligned with the deep SC RESURF trenches. In another embodiment, field oxide may be formed at a top surface of the deep SC RESURF trenches. In a further embodiment, dielectric material may be formed in a central region of each deep SC RESURF trench. In yet another embodiment, conductive material may be formed in a central region of each deep SC RESURF trench and extended above a top surface of the drift region to provide a field plate.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

FIG. 1 is a perspective of an integrated circuit containing a lateral extended drain MOS transistor with deep SC RESURF trenches in a drift region, formed according to a first embodiment. The instant embodiment is described with an n-channel extended drain MOS transistor for exemplary purposes. It will be recognized that a p-channel extended drain MOS transistor may be formed according to the instant embodiment with appropriate changes in polarity of conductivity types. The integrated circuit 1000 is formed in and on a p-type semiconductor substrate 1002 such as a single crystal silicon wafer, a silicon-on-insulator (SOI) wafer, a hybrid orientation technology (HOT) wafer with regions of different crystal orientations, or other material appropriate for fabrication of the integrated circuit 1000. The extended drain MOS transistor includes a n-type source region 1004 in the substrate 1002, a gate dielectric layer 1006 on the substrate 1002 adjacent to the source region 1004, a gate 1008 on the gate dielectric layer 1006, a p-type channel region 1010 in the substrate 1002 under the gate dielectric layer 1006 abutting the source region 1004, an n-type drift region 1012 in the substrate 1002 abutting the channel region 1010 and opposite the source region 1004. The drift region 1012 abuts an n-type drain diffused contact region 1014. In one version of the instant embodiment, an average doping density in the drift region 1012 may be between $5 \times 10^{15}$ cm$^{-3}$ and $1 \times 10^{18}$ cm$^{-3}$.

Deep SC RESURF trenches 1016 are formed in the drift region 1012. The deep SC RESURF trenches 1016 are between 200 nanometers and 5 microns wide, and have a depth:width ratio of at least 5:1. The RESURF trenches 1016 are shallower than the bottom surface of the drift region 1012, so as not to extend through the bottom surface of the drift region 1012. Semiconductor RESURF layers 1018 are formed in the deep SC RESURF trenches 1016 at surfaces of the deep SC RESURF trenches 1016 in contact with the drift region 1012. The semiconductor RESURF layers 1018 have an opposite conductivity type from the drift region 1012; in the instant embodiment, the semiconductor RESURF layers 1018 are p-type. An average doping density in the semiconductor RESURF layers 1018 is between $5 \times 10^{15}$ cm$^{-3}$ and $1 \times 10^{18}$ cm$^{-3}$. In one version of the instant embodiment, the semiconductor RESURF layers 1018 may fill the deep SC RESURF trenches 1016. In another version, the semiconductor RESURF layers 1018 may have a central region filled with another material, as depicted in FIG. 1, such as a gas, a dielectric material such as silicon dioxide, or a semiconductor material such as polycrystalline silicon, referred to herein as polysilicon.

An optional field oxide element, not shown, may be formed over the drift region 1012 at the drain diffused contact region 1014. The field oxide element may be formed prior to, or after, formation of the deep SC RESURF trenches 1016.

Figure 2:
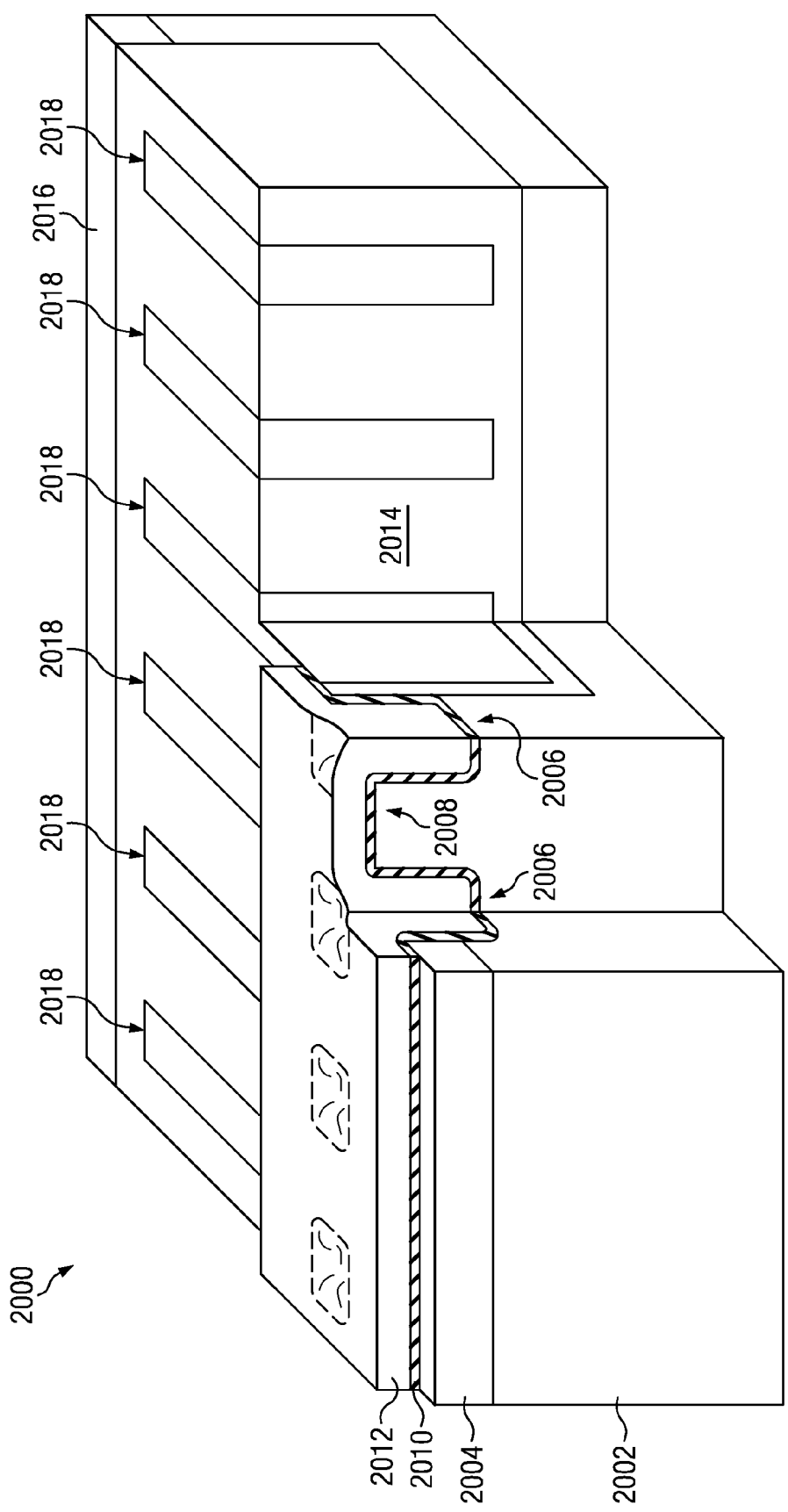
FIG. 2 is a perspective of an integrated circuit containing a lateral extended drain MOS transistor with deep SC RESURF trenches in a drift region, formed according to a second embodiment.

FIG. 2 is a perspective of an integrated circuit 2000 containing a lateral extended drain MOS transistor with deep SC RESURF trenches in a drift region, formed according to a second embodiment. The instant embodiment is described with an re-channel extended drain MOS transistor for exemplary purposes. It will be recognized that a p-channel extended drain MOS transistor may be formed according to the instant embodiment with appropriate changes in polarity of conductivity types. The integrated circuit 2000 is formed in and on a substrate 2002 having the materials and properties described in reference to FIG. 1. The extended drain MOS transistor includes a n-type source region 2004 in the substrate 2002. The substrate 2002 has finger trenches 2006 in a channel region 2008. A gate dielectric layer 2010 and gate 2012 are formed on the substrate 2002 over the channel region 2008 and in the finger trenches 2006, adjacent to the source region 2004. An n-type drift region 2014 is formed in the substrate 2002 abutting the channel region 2008 and opposite the source region 2004. The drift region 2012 abuts an n-type drain diffused contact region 2016.

Deep SC RESURF trenches 2018 are formed in the drift region 2014. The deep SC RESURF trenches 2018 have the properties and configurations described in reference to FIG. 1. An optional field oxide element may be formed over the drift region 2012 at the drain diffused contact region 2014, as described in reference to FIG. 1.

Figure 3A:
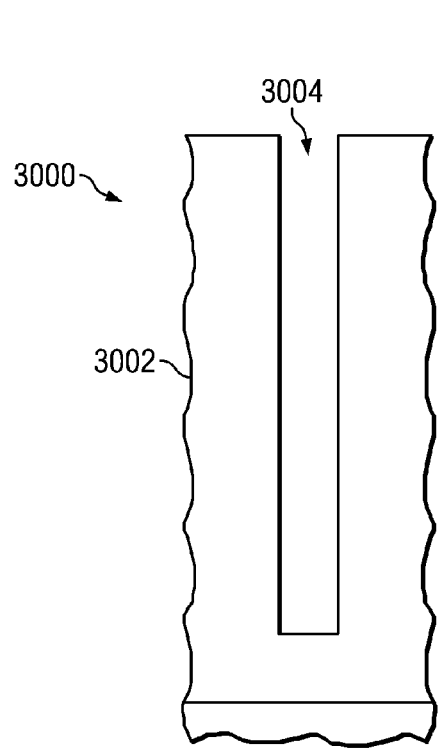
FIG. 3A and FIG. 3B are cross sections of an integrated circuit containing deep SC RESURF trenches in a lateral extended drain MOS transistor, formed according to an embodiment, depicted in successive stages of fabrication.
Figure 3B:
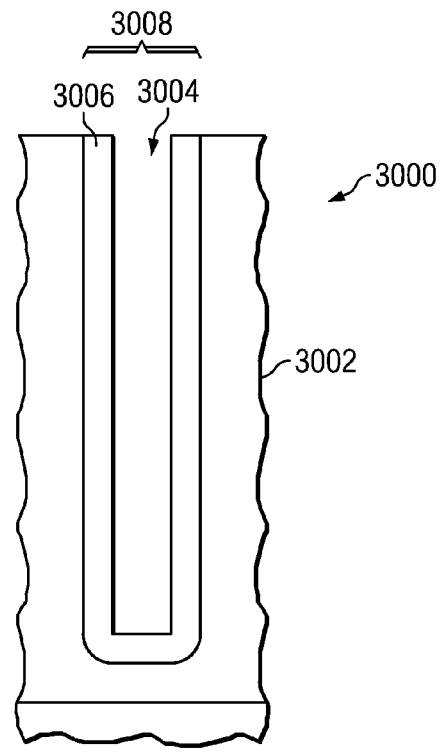

FIG. 3A and FIG. 3B are cross sections of an integrated circuit 3000 containing deep SC RESURF trenches in a lateral extended drain MOS transistor, formed according to an embodiment, depicted in successive stages of fabrication. Referring to FIG. 3A, a drift region 3002 is formed in the MOS transistor in the integrated circuit 3000. The drift region 3002 has a first conductivity type, for example n-channel extended drain MOS transistors have n-type drift regions. An undersized trench 3004 is etched in the drift region 3002, for example by forming a trench etch mask, not shown, over the drift region and performing a trench etch process, such as a reactive ion etch (RIE) process, on the integrated circuit 3000 to remove material from the drift region 3002 so as to form the undersized trench 3004.

Referring to FIG. 3B, a counterdoped semiconductor RESURF layer 3006 of semiconductor RESURF material is formed at a sidewall and a bottom of the undersized trench 3004. The counterdoped semiconductor RESURF layer 3006 has an opposite conductivity type from the drift region 3002. An average net doping density in the counterdoped semiconductor RESURF layer 3006 is between $5 \times 10^{15}$ cm$^{-3}$ and $1 \times 10^{18}$ cm$^{-3}$. The counterdoped semiconductor RESURF layer 3006 may be formed, for example, by performing a furnace diffusion process on the integrated circuit 3000 which introduces gas phase dopants in the trench 3004, causing the dopants to diffuse into the drift region 3002. A combination of the counterdoped semiconductor RESURF layer 3006 and the trench 3004 form a deep SC RESURF trench 3008. A depth:width ratio of the deep SC RESURF trench 3008 is at least 5:1. The deep SC RESURF trench 3008 does not extend through a bottom surface of the drift region 3002. The trench 3004 may be subsequently partially or completely filled with dielectric material and/or electrically conductive material such as polysilicon.

Figure 4A:
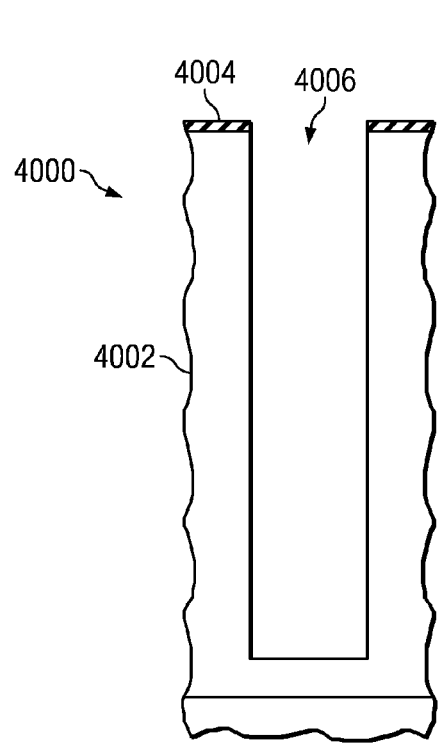
FIG. 4A through FIG. 4C are cross sections of an integrated circuit containing deep SC RESURF trenches in a lateral extended drain MOS transistor, formed according to an embodiment, depicted in successive stages of fabrication.
Figure 4B:
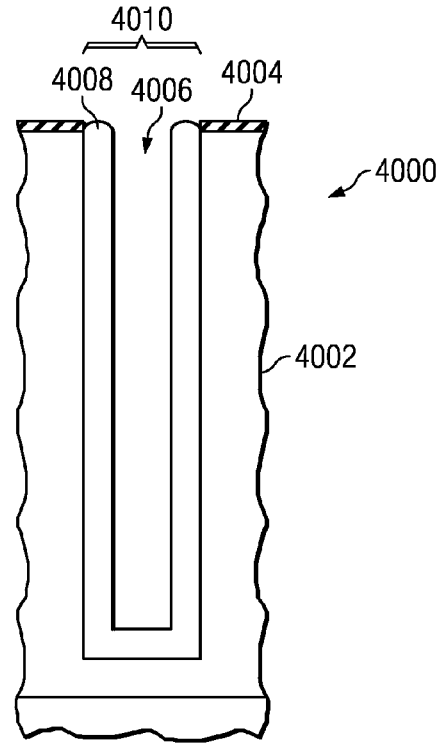
Figure 4C:
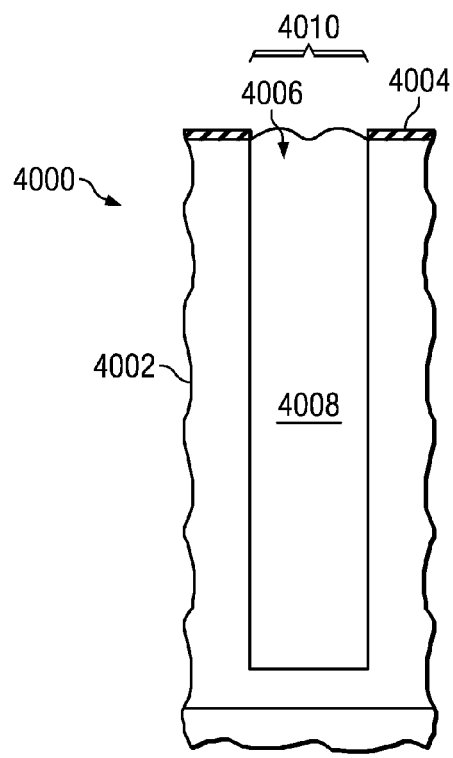

FIG. 4A through FIG. 4C are cross sections of an integrated circuit 4000 containing deep SC RESURF trenches in a lateral extended drain MOS transistor, formed according to an embodiment, depicted in successive stages of fabrication. Referring to FIG. 4A, a drift region 4002 is formed in the MOS transistor in the integrated circuit 4000. An optional epitaxial blocking layer 4004, for example a silicon dioxide layer, may be formed on or over a top surface of the drift region 4002. A trench 4006 is formed in the drift region 4002, through the blocking layer 4004 if present. The trench 4006 may be formed, for example by an RIE process.

Referring to FIG. 4B, an epitaxial semiconductor RESURF layer 4008 is formed on a sidewall and a bottom of the trench 4006 by an epitaxial growth process. The epitaxial growth process may include, for example, thermal decomposition of a silicon containing gas such as silane, dichlorosilane or silicon tetra chloride, at a temperature above 1000° C. Dopants are introduced into the epitaxial semiconductor RESURF layer 4008 during the epitaxial growth process so that the epitaxial RESURF layer 4008 has an opposite conductivity type from the drift region 4002. An average net doping density in the epitaxial semiconductor RESURF layer 4008 is between $5 \times 10^{15}$ cm$^{-3}$ and $1 \times 10^{18}$ cm$^{-3}$. A combination of the epitaxial semiconductor RESURF layer 4008 and the trench 4006 form a deep SC RESURF trench 4010. A depth:width ratio of the deep SC RESURF trench 4010 is at least 5:1. The deep SC RESURF trench 4010 does not extend through a bottom surface of the drift region 4002. In one version of the instant embodiment, a central region in the trench 4006 may be subsequently partially or completely filled with dielectric material and/or electrically conductive material such as polysilicon. In another version, the trench 4006 may be completely filled with the epitaxial RESURF layer 4008 as depicted in FIG. 4C.

Figure 5A:
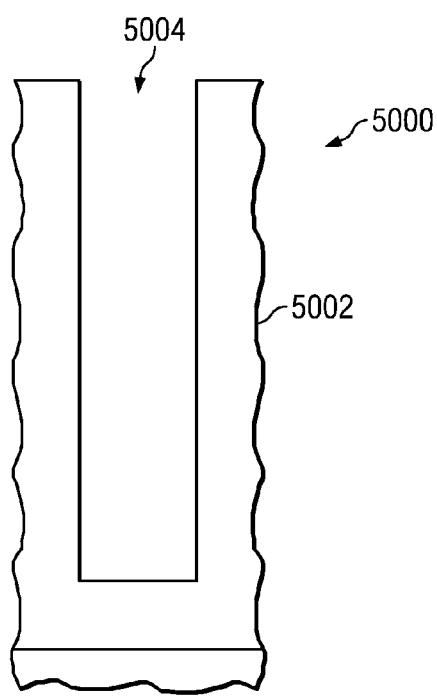
FIG. 5A through FIG. 5C are cross sections of an integrated circuit containing deep SC RESURF trenches in a lateral extended drain MOS transistor, formed according to an embodiment, depicted in successive stages of fabrication.
Figure 5B:
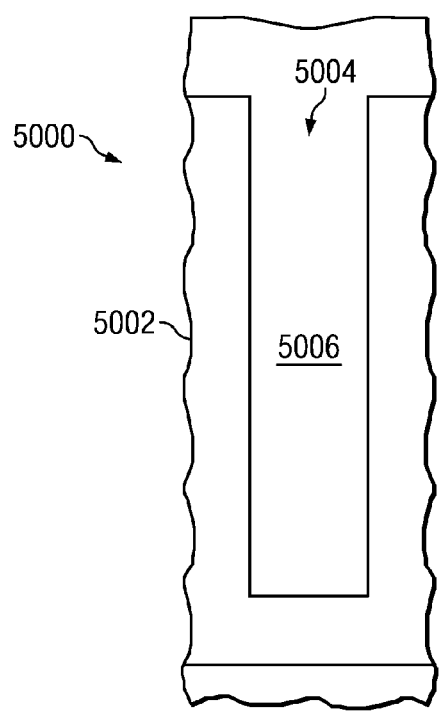
Figure 5C:
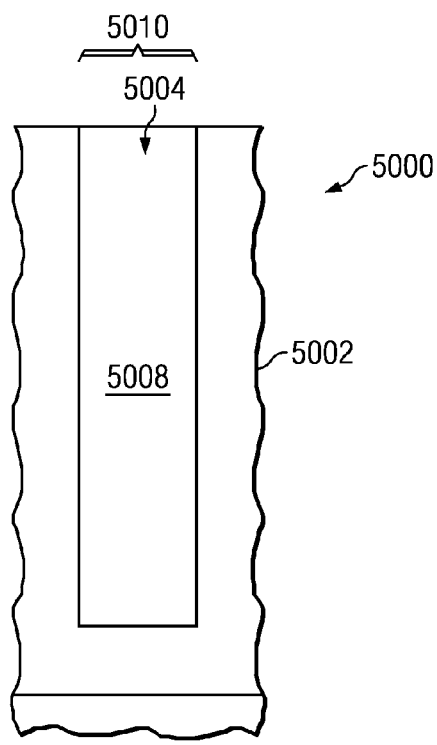

FIG. 5A through FIG. 5C are cross sections of an integrated circuit 5000 containing deep SC RESURF trenches in a lateral extended drain MOS transistor, formed according to an embodiment, depicted in successive stages of fabrication. Referring to FIG. 5A, a drift region 5002 is formed in the MOS transistor in the integrated circuit 5000. A trench 5004 is formed in the drift region 5002. The trench 4006 may be formed, for example by an RIE process.

Referring to FIG. 5B, epitaxial RESURF material 5006 is formed in the trench 5004 and over the drift region 5002 by an epitaxial growth process. The epitaxial RESURF material 5006 has an opposite conductivity type from the drift region 5002.

Referring to FIG. 5C, unwanted epitaxial RESURF material 5006 is removed from over the drift region 5002, for example by a chemical mechanical polish (CMP) process and/or an etchback process, to leave epitaxial RESURF material 5006 in the trench 5004 so as to form an epitaxial semiconductor RESURF layer 5008. An average net doping density in the epitaxial semiconductor RESURF layer 5008 is between $5 \times 10^{15}$ cm$^{-3}$ and $1 \times 10^{18}$ cm$^{-3}$. A combination of the epitaxial semiconductor RESURF layer 5008 and the trench 5004 form a deep SC RESURF trench 5010. A depth:width ratio of the deep SC RESURF trench 5010 is at least 5:1. The deep SC RESURF trench 5010 does not extend through a bottom surface of the drift region 5002.

FIG. 6A through FIG. 6C are cross sections of an integrated circuit 6000 containing deep SC RESURF trenches in a lateral extended drain MOS transistor, formed according to an embodiment, depicted in successive stages of fabrication. Referring to FIG. 6A, a drift region 6002 is formed in the MOS transistor in the integrated circuit 6000. Field oxide 6004 is formed at a top surface of the drift region 6002. The field oxide 6004 may be silicon dioxide between 250 and 600 nanometers thick, commonly formed by shallow trench isolation (STI) or local oxidation of silicon (LOCOS) processes.

Referring to FIG. 6B, a trench 6006 is formed in the drift region 6002 through the field oxide 6004. The trench 6006 does not extend through a bottom surface of the drift region 6002.

Referring to FIG. 6C, an epitaxial semiconductor RESURF layer 6008 is formed on a sidewall and a bottom of the trench 6006 by an epitaxial growth process, with the properties described in reference to FIG. 4B. The epitaxial semiconductor RESURF layer 6008 may not form on the field oxide 6004. A combination of the epitaxial semiconductor RESURF layer 6008 and the trench 6006 form a deep SC RESURF trench 6010. A depth:width ratio of the deep SC RESURF trench 6010, including a portion through the field oxide 6004, is at least 5:1. The deep SC RESURF trench 6010 may be subsequently partially or completely filled with epitaxial RESURF material, dielectric material and/or electrically conductive material such as polysilicon.

Figure 7B:
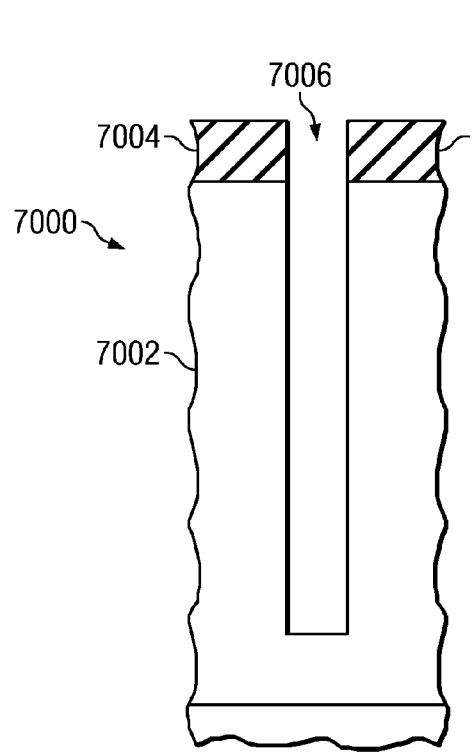
Figure 7C:
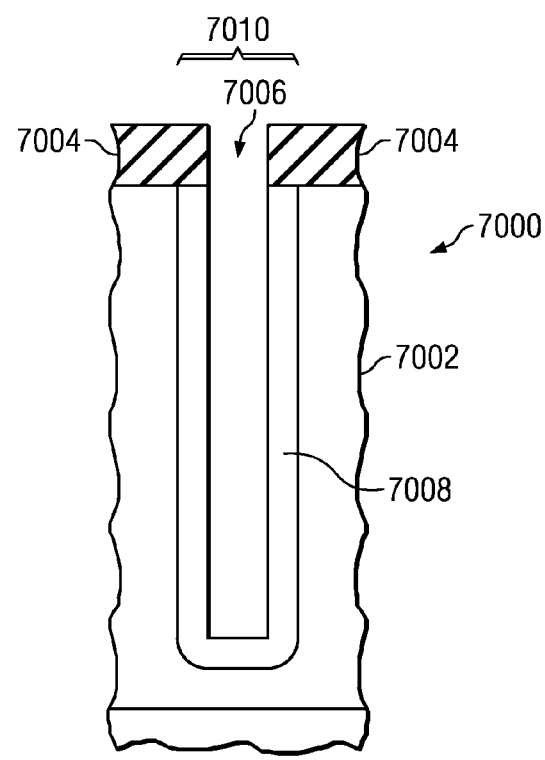

FIG. 7A through FIG. 7C are cross sections of an integrated circuit 7000 containing deep SC RESURF trenches in a lateral extended drain MOS transistor, formed according to an embodiment, depicted in successive stages of fabrication. Referring to FIG. 7A, a drift region 7002 is formed in the MOS transistor in the integrated circuit 7000. Field oxide 7004 is formed at a top surface of the drift region 7002, as described in reference to FIG. 6A.

Referring to FIG. 7B, an undersized trench 7006 is formed in the drift region 7002 through the field oxide 7004. Referring to FIG. 7C, a counterdoped semiconductor RESURF layer 7008 is formed at a sidewall and a bottom of the undersized trench 7006 in the drift region 7002. The counterdoped semiconductor RESURF layer 7008 has the properties and may be formed by the processes described in reference to FIG. 3B A combination of the counterdoped semiconductor RESURF layer 7008 and the undersized trench 7006 form a deep SC RESURF trench 7010. A depth:width ratio of the deep SC RESURF trench 7010, including a portion through the field oxide 6004, is at least 5:1. The deep SC RESURF trench 7010 does not extend through a bottom surface of the drift region 7002. The deep SC RESURF trench 7010 may be subsequently partially or completely filled with dielectric material and/or electrically conductive material such as polysilicon.

Figure 8A:
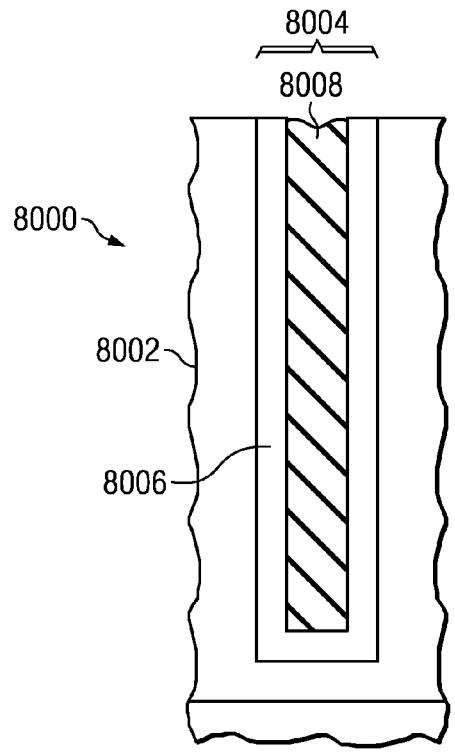
FIG. 8A and FIG. 8B are cross sections of an integrated circuit containing deep SC RESURF trenches in a lateral extended drain MOS transistor, formed according to an embodiment, depicted in successive stages of fabrication.
Figure 8B:
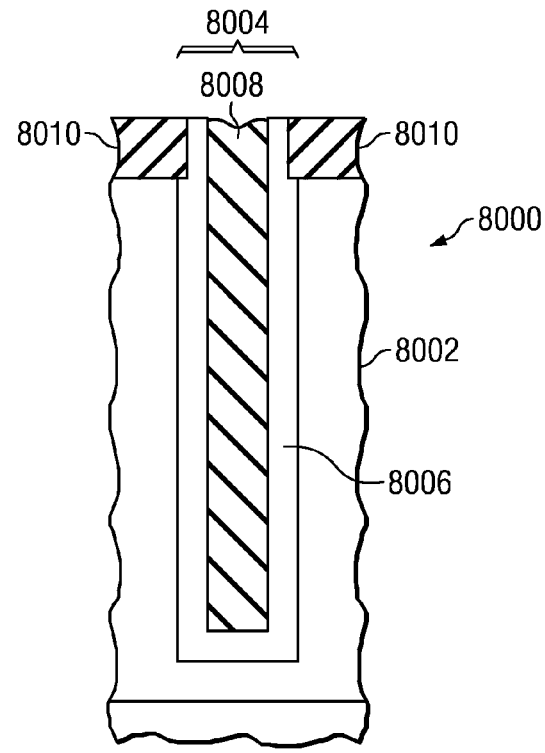

FIG. 8A and FIG. 8B are cross sections of an integrated circuit 8000 containing deep SC RESURF trenches in a lateral extended drain MOS transistor, formed according to an embodiment, depicted in successive stages of fabrication. Referring to FIG. 8A, a drift region 8002 is formed in the MOS transistor in the integrated circuit 8000. A deep SC RESURF trench 8004 is formed in the drift region 8002. The deep SC RESURF trench 8004 includes a semiconductor RESURF layer 8006 formed, for example, according to one of the embodiments discussed in reference to FIG. 3A and FIG. 3B or FIG. 4A and FIG. 4B. A trench filler 8008 of dielectric material such as silicon dioxide or electrically conducting material such as polysilicon, is formed in the deep SC RESURF trench 8004.

Referring to FIG. 8B, field oxide 8010 is formed at a top surface of the drift region 8002 abutting a top portion of the deep SC RESURF trench 8004. The field oxide 8010 may be formed for example by an STI process. A depth:width ratio of the deep SC RESURF trench 8004, including a portion through the field oxide 8010, is at least 5:1.

FIG. 9A and FIG. 9B are cross sections of an integrated circuit 9000 containing deep SC RESURF trenches in a lateral extended drain MOS transistor, formed according to an embodiment, depicted in successive stages of fabrication. Referring to FIG. 9A, a drift region 9002 is formed in the MOS transistor in the integrated circuit 9000. A deep SC RESURF trench 9004 is formed in the drift region 9002. The deep SC RESURF trench 9004 includes a semiconductor RESURF layer 9006 formed, for example, according to one of the embodiments discussed in reference to FIG. 3A and FIG. 3B or FIG. 4A and FIG. 4B. A trench filler 9008 of dielectric material such as silicon dioxide or electrically conducting material such as polysilicon, is formed in the deep SC RESURF trench 9004.

Referring to FIG. 9B, field oxide 9010 is formed at a top surface of the drift region 9002 so as to replace a top portion of the deep SC RESURF trench 9004 with field oxide material. The field oxide 9010 may be formed as described in reference to FIG. 8A. A depth:width ratio of the deep SC RESURF trench 9004, including a portion replaced by the field oxide 9010, is at least 5:1.

FIG. 10A and FIG. 10B are cross sections of an integrated circuit 10000 containing deep SC RESURF trenches in a lateral extended drain MOS transistor, formed according to an embodiment, depicted in successive stages of fabrication. Referring to FIG. 10A, a drift region 10002 is formed in the MOS transistor in the integrated circuit 10000. A deep SC RESURF trench 10004 is formed in the drift region 10002, including a semiconductor RESURF layer 10006. The semiconductor RESURF layer 10006 may be formed, for example, according to one of the embodiments discussed in reference to FIG. 3A and FIG. 3B or FIG. 4A and FIG. 4B. The deep SC RESURF trench 10004 has a central region 10008 which is free of semiconductor RESURF material from the semiconductor RESURF layer 10006.

Referring to FIG. 10B, a dielectric liner 10010 is formed in the central region 10008 on the semiconductor RESURF layer 10006. The dielectric liner 10010 may include one or more layers of dielectric material such as silicon dioxide, silicon nitride and silicon oxynitride. The dielectric liner 10010 may be formed by one or more processes, including thermal oxidation of an exposed surface of the semiconductor RESURF layer 10006 in an oxygen containing ambient, thermal decomposition of tetraethyl orthosilicate, also known as tetraethoxysilane or TEOS, chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal chemical vapor deposition (CVD) process, also known as the high aspect ratio process (HARP), or other suitable dielectric layer formation process. A depth:width ratio of the deep SC RESURF trench 10004 including the dielectric liner 10010 is at least 5:1.

Figure 11A:
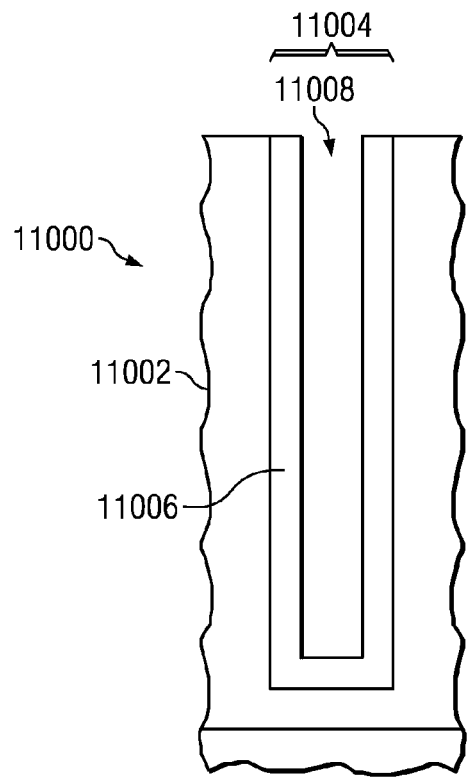
FIG. 11A through FIG. 11C are cross sections of an integrated circuit containing deep SC RESURF trenches in a lateral extended drain MOS transistor, formed according to an embodiment, depicted in successive stages of fabrication.
Figure 11B:
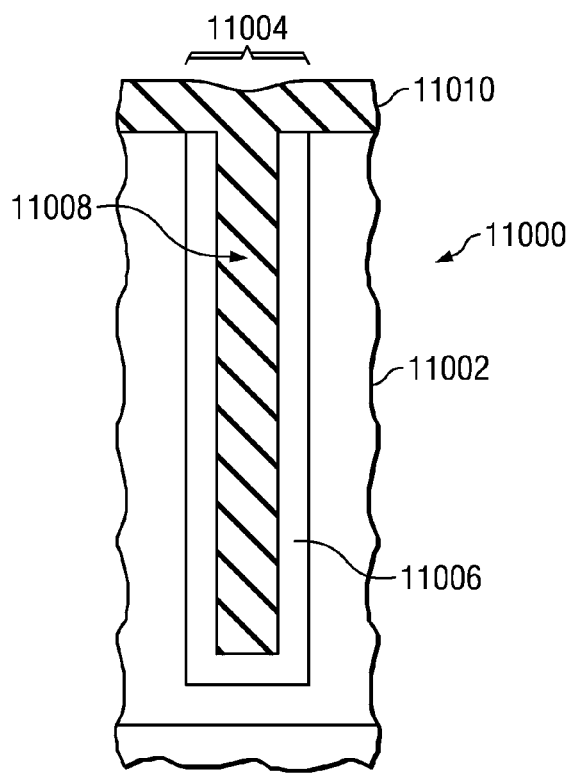
Figure 11C:
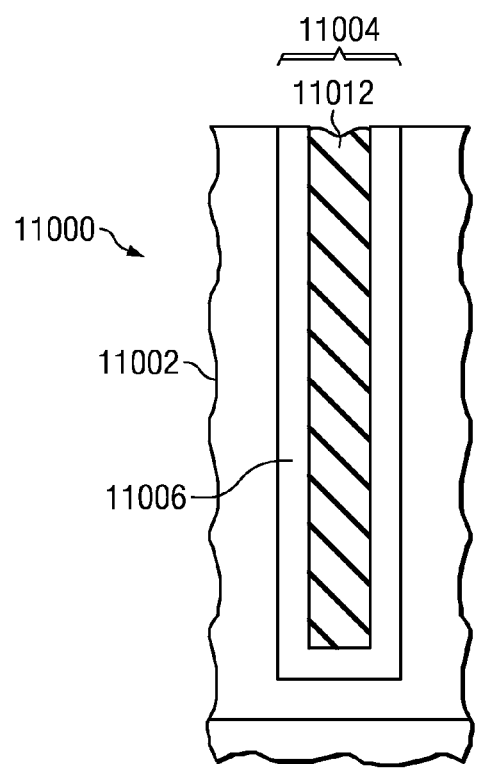

FIG. 11A through FIG. 11C are cross sections of an integrated circuit 11000 containing deep SC RESURF trenches in a lateral extended drain MOS transistor, formed according to an embodiment, depicted in successive stages of fabrication. Referring to FIG. 11A, a drift region 11002 is formed in the MOS transistor in the integrated circuit 11000. A deep SC RESURF trench 11004 is formed in the drift region 11002, including a semiconductor RESURF layer 11006. The semiconductor RESURF layer 11006 may be formed, for example, according to one of the embodiments discussed in reference to FIG. 3A and FIG. 3B or FIG. 4A and FIG. 4B. The deep SC RESURF trench 11004 has a central region 11008 which is free of semiconductor RESURF material.

Referring to FIG. 11B, trench fill material 11010 is formed in the central region 11008 and possibly over the drift region 11002. A blocking layer, not shown, may be formed over a top surface of the drift region 11002 prior to forming the trench fill material 11010. The trench fill material 11010 may include one or more layers of dielectric material such as silicon dioxide, silicon nitride and silicon oxynitride, and/or one or more layers of electrically conductive material such as polysilicon. Dielectric material in the trench fill material 11010 may be formed as described in reference to FIG. 6B. Polysilicon in the trench fill material 11010 may be formed, for example, by thermally decomposing SiH4 gas inside a low-pressure reactor at a temperature between 580° C. to 650° C.

Referring to FIG. 11C, unwanted trench fill material is removed from over the drift region 11002, for example by a CMP process and/or an etchback process, to form a trench filler 11012. A depth:width ratio of the deep SC RESURF trench 11004 including the trench filler 11012 is at least 5:1.

Figure 12A:
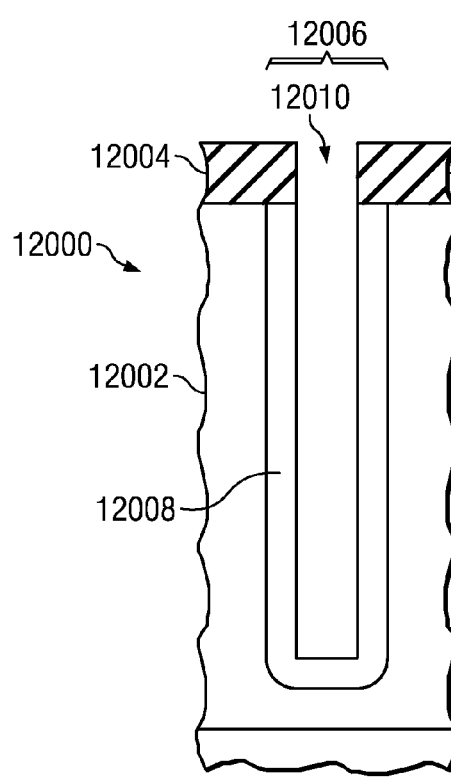
FIG. 12A through FIG. 12C are cross sections of an integrated circuit containing deep SC RESURF trenches in a lateral extended drain MOS transistor, formed according to an embodiment, depicted in successive stages of fabrication.
Figure 12B:
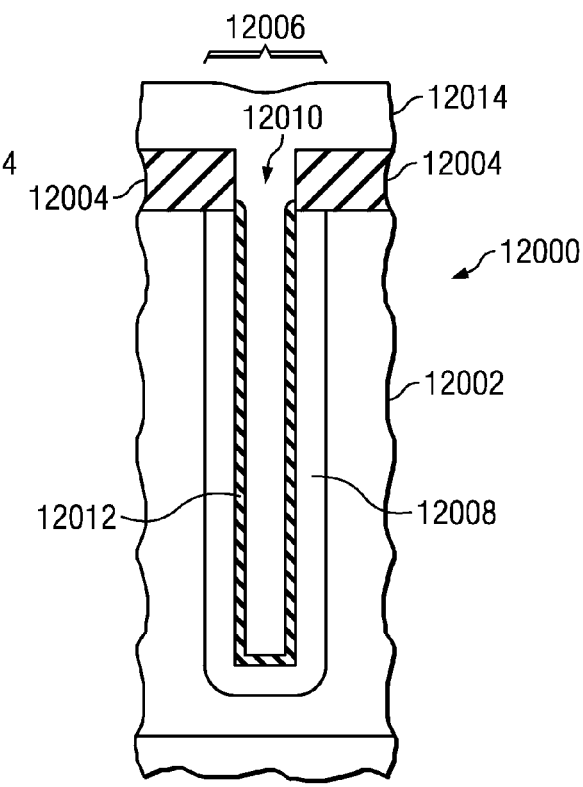
Figure 12C:
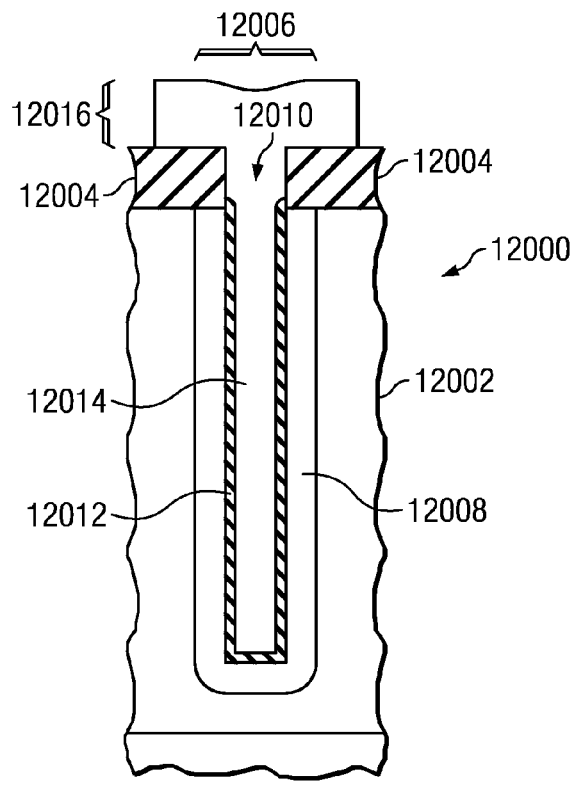

FIG. 12A through FIG. 12C are cross sections of an integrated circuit 12000 containing deep SC RESURF trenches in a lateral extended drain MOS transistor, formed according to an embodiment, depicted in successive stages of fabrication. Referring to FIG. 12A, a drift region 12002 is formed in the MOS transistor in the integrated circuit 12000. An element of field oxide 12004 is formed over the drift region 12002. A deep SC RESURF trench 12006 is formed in the drift region 12002. The field oxide 12004 is adjacent to the deep SC RESURF trench 12006. The field oxide 12004 and deep SC RESURF trench 12006 may be formed for example by any of the embodiments described herein. The deep SC RESURF trench 12006 includes a semiconductor RESURF layer 12008. The deep SC RESURF trench 12006 has a central region 12010 which is free of semiconductor RESURF material.

Referring to FIG. 12B, a dielectric liner 12012 is formed in the central region 12010 on an exposed surface of the semiconductor RESURF layer 12008. The dielectric liner 12012 may include, for example, one or more layers of silicon dioxide, silicon nitride and/or silicon oxynitride. The dielectric liner 12012 may be formed, for example, by thermally oxidizing the exposed surface of the semiconductor RESURF layer 12008, thermally decomposing TEOS, or by depositing dielectric material using CVD, PECVD, LPCVD, APCVD, HDP, HARP, or other suitable dielectric layer formation process. The dielectric liner 12012 may extend onto the field oxide 12004. Electrically conductive trench fill material 12014 is formed in the central region 12010 on the dielectric liner 12012 and over the drift region 12002. The trench fill material 12014 may include one or more layers of electrically conductive material such as polysilicon, aluminum or tungsten. The trench fill material 12014 may be formed, for example, by sputtering, evaporation, metal organic chemical vapor deposition (MOCVD), thermal decomposition of silicon containing gases such as silane or dichlorosilane, or other conductive material layer formation process.

Referring to FIG. 12C, the trench fill material 12014 over the drift region 12002 is patterned, for example by photolithographically masking and etching, to form a field plate 12016 over the drift region 12002. The field plate 12016 is continuous with the trench fill material in the deep SC RESURF trench 12006. A depth:width ratio of the deep SC RESURF trench 12006, not including the field plate 12016, is at least 5:1.

Figure 13:
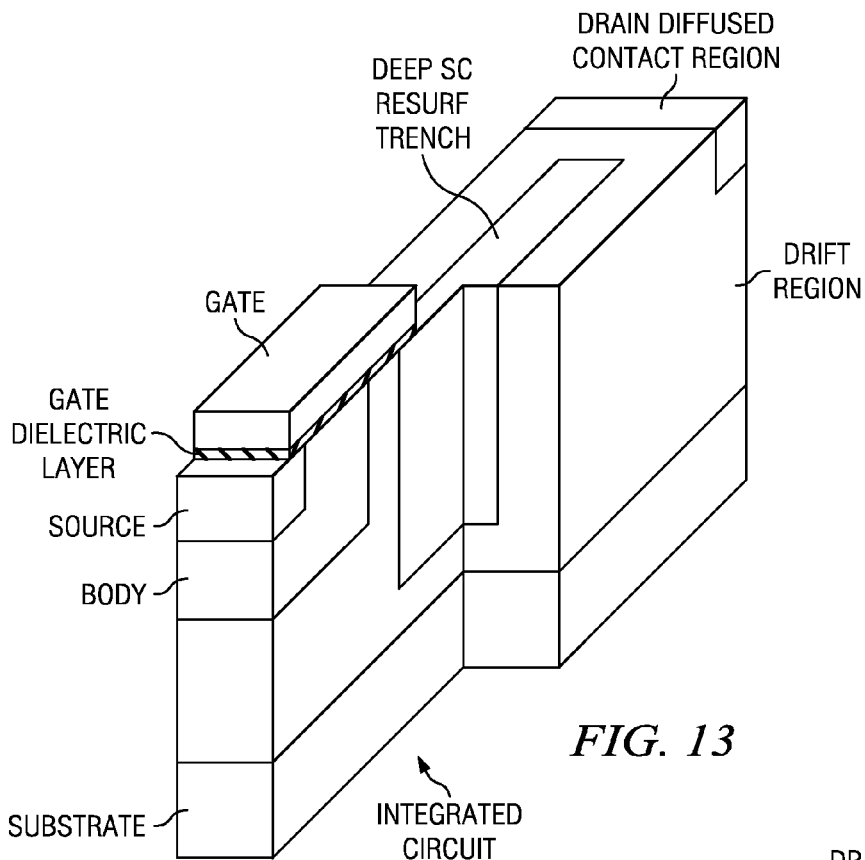
FIG. 13 through FIG. 17 depict embodiments of integrated circuits with various configurations of lateral extended drain MOS transistors with deep SC RESURF trenches in drift regions.
Figure 14:
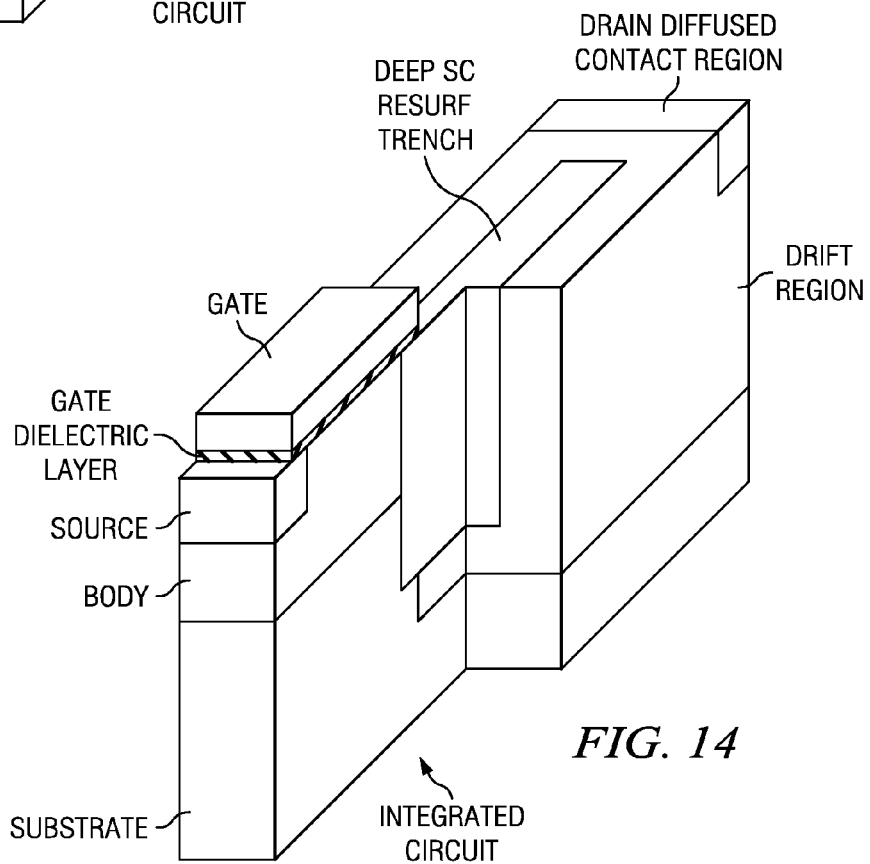
Figure 15:
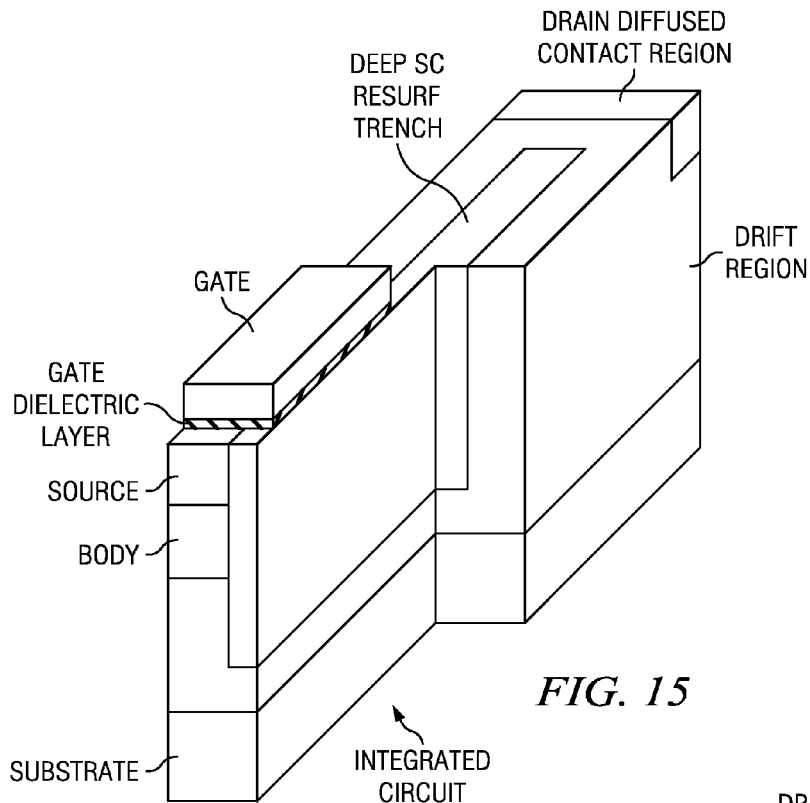
Figure 16:
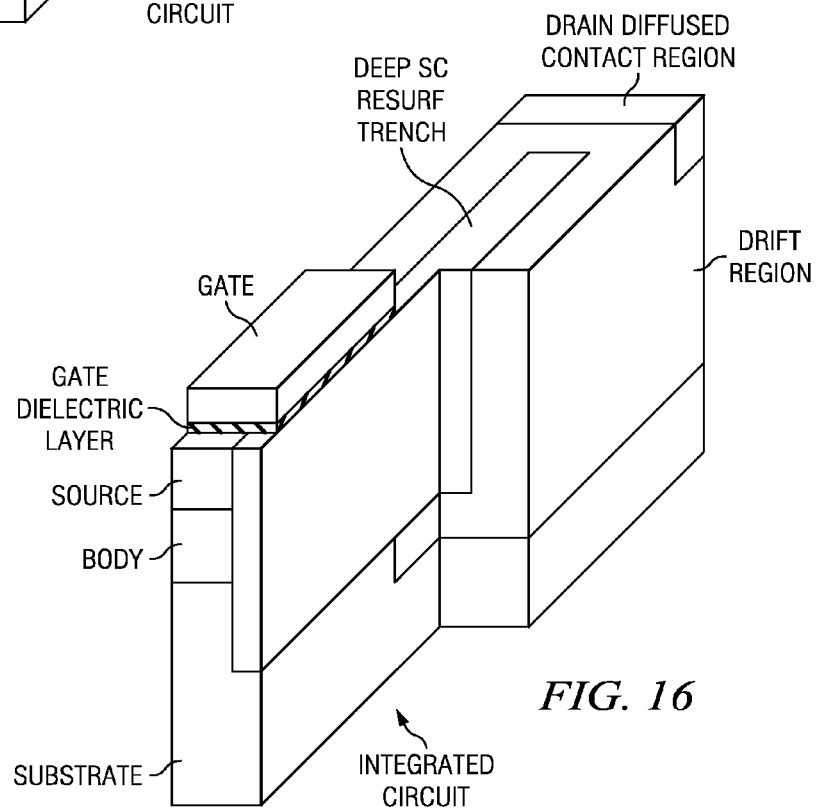
Figure 17:
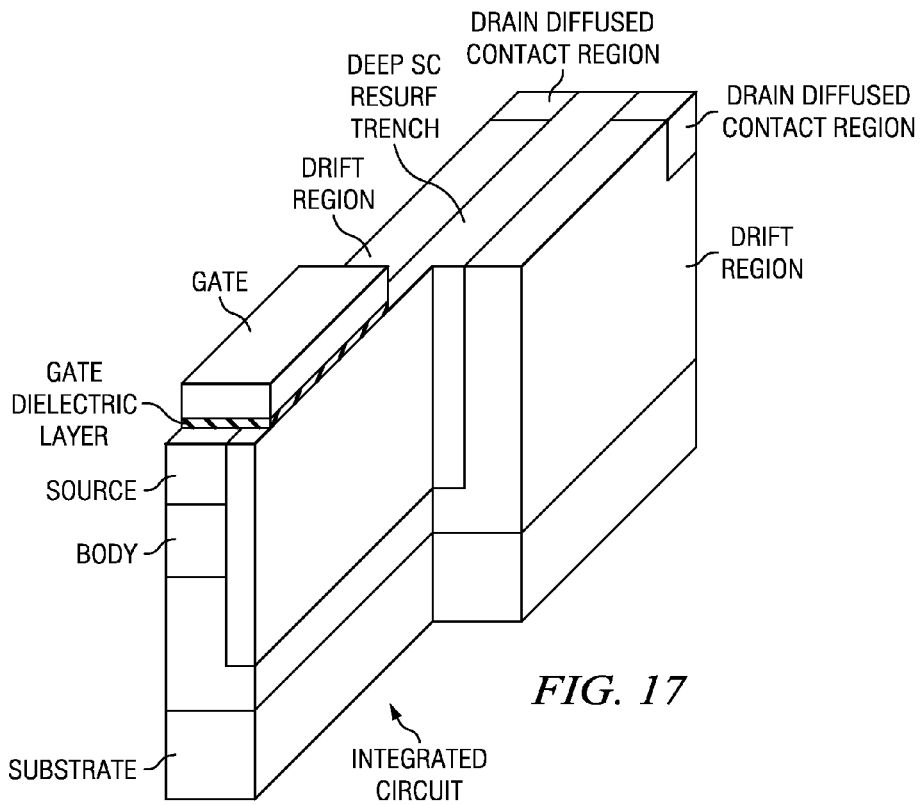

FIG. 13 through FIG. 17 depict embodiments of integrated circuits with various configurations of lateral extended drain MOS transistors with deep SC RESURF trenches in drift regions. FIG. 13 depicts a configuration in which a drift region extends under a body region and a source region, for example as part of an isolation structure to electrically isolate the body from a substrate of the integrated circuit. FIG. 14 depicts a configuration in which deep SC RESURF trenches laterally abut the body region. FIG. 15 depicts a configuration in which a drift region extends under a body region and a source region, and deep SC RESURF trenches extend through the body region and source region. FIG. 16 depicts a configuration in which deep SC RESURF trenches extend through a body region and source region, while a drift region does not extend past the body region. FIG. 17 depicts a configuration in which deep SC RESURF trenches extend through a drain diffused contact region, as well as through a body region and source region.

Figure 18:
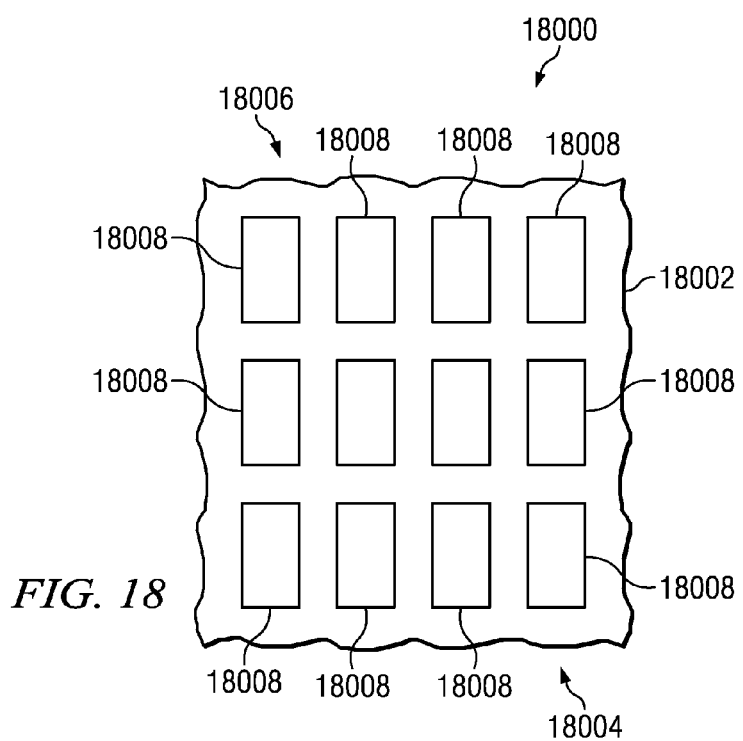
FIG. 18 through FIG. 20 depict top views of integrated circuits with various configurations deep SC RESURF trenches in lateral extended drain MOS transistors.
Figure 19:
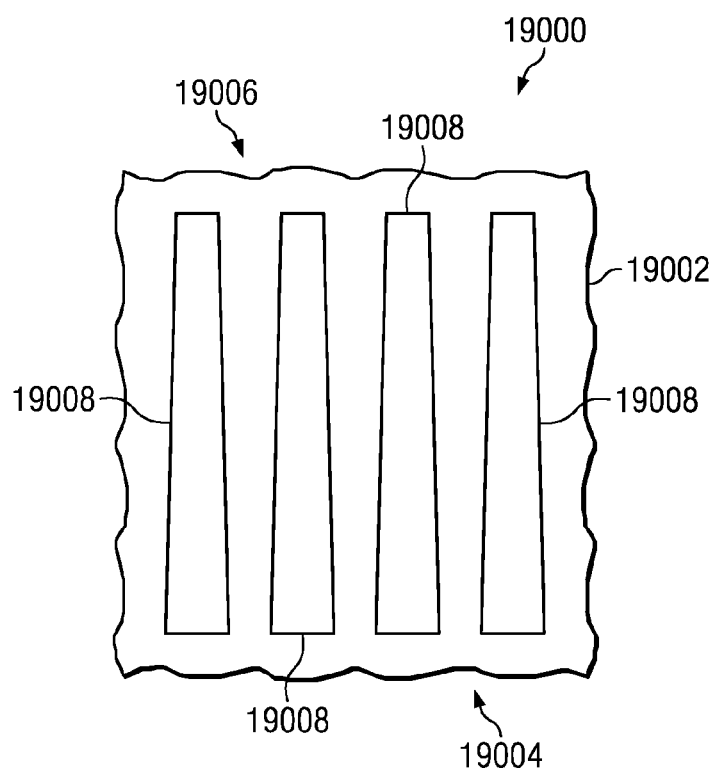
Figure 20:
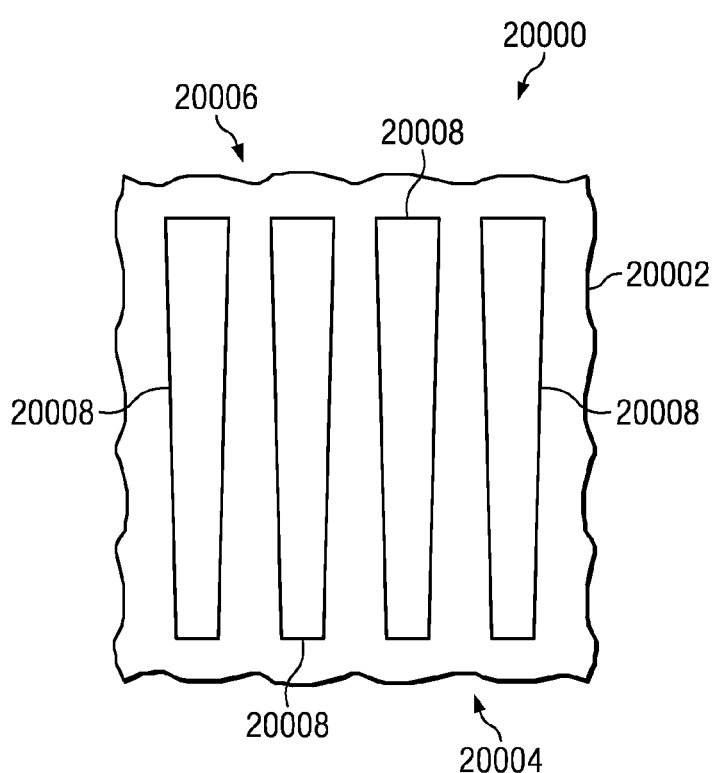

FIG. 18 through FIG. 20 depict top views of integrated circuits with various configurations deep SC RESURF trenches in lateral extended drain MOS transistors. Referring to FIG. 18, an integrated circuit 18000 contains a lateral extended drain MOS transistor with a drift region 18002 having a drain end 18004 and a channel end 18006. Deep SC RESURF trenches 18008 are formed in a plurality of rows extending from the drain end 18004 to the channel end 18006. Referring to FIG. 19, an integrated circuit 19000 contains a lateral extended drain MOS transistor with a drift region 19002 having a drain end 19004 and a channel end 19006. Tapered deep SC RESURF trenches 19008 are formed in the drift region 19002 so that wide ends of the deep SC RESURF trenches 19008 are at the drain end 19004 and narrow ends of the deep SC RESURF trenches 19008 are at the channel end 19006. Referring to FIG. 20, an integrated circuit 20000 contains a lateral extended drain MOS transistor with a drift region 20002 having a drain end 20004 and a channel end 20006. Tapered deep SC RESURF trenches 20008 are formed in the drift region 20002 so that narrow ends of the deep SC RESURF trenches 20008 are at the drain end 20004 and wide ends of the deep SC RESURF trenches 20008 are at the channel end 20006.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising steps:
   providing a semiconductor substrate;
   forming an extended drain MOS transistor in and on said substrate, by a process including steps:
      forming a drift region in said substrate, said drift region having a first conductivity type;
      forming a plurality of deep SC RESURF trenches in said drift region, by a process including steps:
         forming an undersized trench in said drift region for each said deep SC RESURF trench;
         forming a semiconductor RESURF layer at a sidewall of said undersized trench contacting said drift region, by forming a counterdoped semiconductor RESURF layer of semiconductor RESURF material at a sidewall and a bottom of said undersized trench, so that said semiconductor RESURF layer has an opposite conductivity type from said drift region, so that a depth:width ratio of said deep SC RESURF trench is at least 5:1, and so that said deep SC RESURF trenches do not extend through said bottom surface of said drift region.

2. The process of claim 1, in which said step of forming said semiconductor RESURF layer is performed so that each said deep SC RESURF trench has a central region which is free of semiconductor RESURF material from said semiconductor RESURF layer.

3. The process of claim 2, in which said process of forming said deep SC RESURF trenches further includes a step of forming a dielectric liner in said central region on said semiconductor RESURF layer.

4. The process of claim 2, in which said process of forming said extended drain MOS transistor further includes steps:
   forming field oxide at a top surface of said drift region adjacent to each said deep SC RESURF trench;
   forming a dielectric liner in said central region on said semiconductor RESURF layer
   forming electrically conductive trench fill material in said central region on said dielectric liner and extending over said drift region; and
   patterning electrically conductive trench fill material to form a field plate over said drift region, so that said field plate is continuous with said electrically conductive trench fill material in said central region.

5. The process of claim 1, in which said step of forming said extended drain MOS transistor further includes a step of forming field oxide at a top surface of said drift region prior to said step of forming said a plurality of deep SC RESURF trenches.

6. The process of claim 1, in which that an average net doping density in said counterdoped semiconductor RESURF layer is between $5 \times 10^{15}$ cm$^{-3}$ and $1 \times 10^{18}$ cm$^{-3}$.

7. A process of forming an integrated circuit, comprising steps:
   providing a semiconductor substrate;
   forming an extended drain MOS transistor in and on said substrate, by a process including steps:
      forming a drift region in said substrate, said drift region having a first conductivity type;
      forming a plurality of deep SC RESURF trenches in said drift region, by a process including steps:
         forming a trench in said drift region for each said deep SC RESURF trench;
         forming a semiconductor RESURF layer at a sidewall of said trench by forming an epitaxial semiconductor RESURF layer of semiconductor RESURF material at a sidewall and a bottom of said trench contacting said drift region, so that said semiconductor RESURF layer has an opposite conductivity type from said drift region, and so that a depth:width ratio of said deep SC RESURF trench is at least 5:1, and so that said deep SC RESURF trenches do not extend through said bottom surface of said drift region.

8. The process of claim 7, in which said step of forming said semiconductor RESURF layer is performed so that each said deep SC RESURF trench has a central region which is free of semiconductor RESURF material from said semiconductor RESURF layer.

9. The process of claim 8, in which said process of forming said deep SC RESURF trenches further includes a step of forming a dielectric liner in said central region on said semiconductor RESURF layer.

10. The process of claim 8, in which said process of forming said extended drain MOS transistor further includes steps:
  forming field oxide at a top surface of said drift region adjacent to each said deep SC RESURF trench;
  forming a dielectric liner in said central region on said semiconductor RESURF layer;
  forming electrically conductive trench fill material in said central region on said dielectric liner and extending over said drift region; and
  patterning electrically conductive trench fill material to form a field plate over said drift region, so that said field plate is continuous with said electrically conductive trench fill material in said central region.

11. The process of claim 7, in which said step of forming said semiconductor RESURF layer includes steps:
  forming said epitaxial RESURF material in said trench so that said epitaxial RESURF material fills said trench and extends over said drift region; and
  removing unwanted epitaxial RESURF material from over said drift region so that said semiconductor RESURF layer fills each said deep SC RESURF trench.

12. The process of claim 7, in which said step of forming said extended drain MOS transistor further includes a step of forming field oxide at a top surface of said drift region prior to said step of forming said a plurality of deep SC RESURF trenches.

13. The process of claim 7, in which an average net doping density in said counterdoped semiconductor RESURF layer is between $5 \times 10^{15}$ cm$^{-3}$ and $1 \times 10^{18}$ cm$^{-3}$.

* * * * *